US012586535B2

(12) United States Patent
Chiu et al.

(10) Patent No.: US 12,586,535 B2
(45) Date of Patent: Mar. 24, 2026

(54) DISPLAY HAVING SEMICONDUCTING OXIDE GATE DRIVER CIRCUITRY WITH BOTTOM GATE TERMINALS FOR REDUCED LEAKAGE

(71) Applicant: Apple Inc., Cupertino, CA (US)

(72) Inventors: Hao-Lin Chiu, Los Gatos, CA (US); Chin-Wei Lin, San Jose, CA (US); Shinya Ono, Santa Clara, CA (US); Kyung Wook Kim, Saratoga, CA (US); Szu-Hsien Lee, Los Gatos, CA (US); Pei-En Chang, San Jose, CA (US); Kwang Soon Park, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/654,541

(22) Filed: May 3, 2024

(65) Prior Publication Data

US 2024/0420643 A1     Dec. 19, 2024

Related U.S. Application Data

(60) Provisional application No. 63/507,812, filed on Jun. 13, 2023.

(51) Int. Cl.
*G09G 3/3266* (2016.01)
*H10D 30/67* (2025.01)
(Continued)

(52) U.S. Cl.
CPC ......... *G09G 3/3266* (2013.01); *H10D 86/481* (2025.01); *H10D 86/60* (2025.01);
(Continued)

(58) Field of Classification Search
CPC ....... G09G 2320/0247; G09G 2330/02; G09G 2354/00; G09G 3/3266; H10D 30/6734;
(Continued)

(56) References Cited

U.S. PATENT DOCUMENTS 9,727,165 B2    8/2017  Kitsomboonloha et al.
9,734,783 B2    8/2017  Yu et al.
(Continued)

FOREIGN PATENT DOCUMENTS

WO          2021007883 A1     1/2021

*Primary Examiner* — Nitin Patel
*Assistant Examiner* — Amen W Bogale
(74) *Attorney, Agent, or Firm* — Treyz Law Group; Jason Tsai

(57) ABSTRACT

A driver circuit configured to output a control signal to a row of display pixels is provided. The driver circuit can include a first transistor having a drain terminal coupled to a first positive power supply line, a gate terminal, and a source terminal that is coupled to an output port of the driver circuit on which the control signal is generated and a second transistor having a drain terminal coupled to the output port of the driver circuit, a gate terminal, and a source terminal that is coupled to a first ground power supply line. The first and second transistors can be coupled to a plurality of transistors coupled between a second positive power supply line and a second ground power supply line, configured to receive one or more clocks signals, and at least some of which include bottom gate terminals.

16 Claims, 9 Drawing Sheets

(51) Int. Cl.
　　*H10D 86/40* 　　　　(2025.01)
　　*H10D 86/60* 　　　　(2025.01)

(52) U.S. Cl.
　　CPC . *G09G 2320/0247* (2013.01); *G09G 2330/02*
　　　　　(2013.01); *G09G 2354/00* (2013.01); *H10D*
　　　　　　　　　　　　　　　　　　*30/6734* (2025.01)

(58) Field of Classification Search
　　CPC .. H10D 86/423; H10D 86/431; H10D 86/481;
　　　　　　　　　　　　　　　　　　　　H10D 86/60
　　See application file for complete search history.

(56) 　　　　　　　　　References Cited

U.S. PATENT DOCUMENTS

| | | |
|---|---|---|
| 9,842,551 B2 | 12/2017 | Yamashita et al. |
| 10,037,738 B2 | 7/2018 | Kitsomboonloha et al. |
| 10,078,405 B2 | 9/2018 | Jamshidi Roudbari et al. |
| 10,373,562 B2 | 8/2019 | Zhang et al. |
| 10,522,087 B2 | 12/2019 | Lin et al. |
| 10,777,128 B2 | 9/2020 | Feng et al. |
| 10,923,022 B2 | 2/2021 | Lin et al. |
| 2018/0130418 A1 | 5/2018 | Zhu et al. |
| 2021/0225251 A1 | 7/2021 | Xu et al. |
| 2022/0093027 A1* | 3/2022 | Hong ...................... G11C 19/28 |
| 2023/0075599 A1* | 3/2023 | Kim ...................... H10K 59/126 |
| 2023/0105266 A1* | 4/2023 | Hong ................... G09G 3/3275 |
| | | 345/212 |
| 2023/0125324 A1* | 4/2023 | Sato .................... H10D 86/471 |
| | | 345/55 |
| 2023/0217759 A1* | 7/2023 | Seo .................... H10K 59/8052 |
| | | 257/40 |
| 2023/0326411 A1* | 10/2023 | In .......................... G11C 19/28 |

\* cited by examiner

DISPLAY HAVING SEMICONDUCTING OXIDE GATE DRIVER CIRCUITRY WITH BOTTOM GATE TERMINALS FOR REDUCED LEAKAGE

This application claims the benefit of U.S. Provisional Patent Application No. 63/507,812, filed Jun. 13, 2023, which is hereby incorporated by reference herein in its entirety.

FIELD

This relates generally to electronic devices with displays and, more particularly, to display driver circuitry for displays such as organic light-emitting diode (OLED) displays.

BACKGROUND

Electronic devices often include displays. For example, cellular telephones, tablets, wrist-watches, and portable computers typically include displays for presenting image content to users. OLED displays have an array of display pixels based on light-emitting diodes. In this type of display, gate driver circuitry is used to provide control signals to respective rows in the array of display pixels. It can be challenging to design the gate driver circuitry.

SUMMARY

An electronic device may include a display having an array of display pixels. The display pixels may be organic light-emitting diode display pixels. Each display pixel may include at least an organic light-emitting diode (OLED) that emits light and associated semiconducting oxide transistors. The array of display pixels may receive control signals such as gate output signals from peripheral gate driver circuitry. The gate driver circuitry may include gate driver circuits connected in a chain.

An aspect of the disclosure provides a gate driver circuit that includes: a first transistor having a drain terminal coupled to a first positive power supply line, a gate terminal, and a source terminal that is coupled to an output port of the gate driver circuit, the control signal being generated at the output port; a second transistor having a drain terminal coupled to the output port of the gate driver circuit, a gate terminal, and a source terminal that is coupled to a first ground power supply line; and a third transistor having a drain terminal coupled to a second positive power supply line different than the first positive power supply line, a gate terminal coupled to the gate terminal of the first transistor, a source terminal on which a carry output signal is generated, and a bottom gate terminal shorted to its source terminal.

An aspect of the disclosure provides a gate driver circuit that includes: a first transistor having a drain terminal coupled to a first positive power supply line, a gate terminal, and a source terminal that is coupled to an output port of the gate driver circuit, the control signal being generated at the output port; a first capacitor coupled across the gate terminal of the first transistor and the output port of the of driver circuit; a second transistor having a drain terminal coupled to the output port of the gate driver circuit, a gate terminal, and a source terminal that is coupled to a first ground power supply line; a third transistor having a drain terminal coupled to a second positive power supply line different than the first positive power supply line, a gate terminal coupled to the gate terminal of the first transistor, and a source terminal on which a carry output signal is generated; and a fourth transistor having a gate terminal coupled to the gate terminal of the second transistor, a drain terminal coupled to the source terminal of the third transistor, a source terminal coupled to a second ground power supply line different than the first ground power supply line, and a bottom gate terminal coupled to the second ground power supply line.

An aspect of the disclosure provides a gate driver circuit that includes: a first transistor having a drain terminal coupled to a first positive power supply line, a gate terminal, and a source terminal that is coupled to an output port of the gate driver circuit, the control signal being generated at the output port; a first capacitor coupled across the gate terminal of the first transistor and the output port of the of driver circuit; a second transistor having a drain terminal coupled to the output port of the driver circuit, a gate terminal, and a source terminal that is coupled to a first ground power supply line; and a third transistor having a gate terminal coupled to the gate terminal of the second transistor, a drain terminal coupled to the gate terminal of the first transistor, a source terminal coupled to a second ground power supply line different than the first ground power supply line, and a bottom gate terminal coupled to the second ground power supply line.

DETAILED DESCRIPTION

Figure 1:
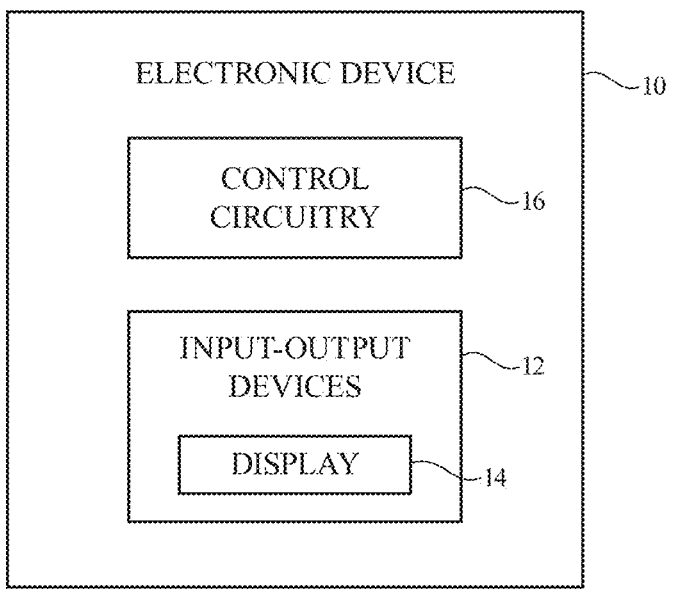
FIG. 1 is a diagram of an illustrative electronic device having a display in accordance with some embodiments.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, application processors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14. Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode (OLED) display are sometimes described herein as an example. This is, however, merely illustrative. Any suitable type of display may be used in device 10, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
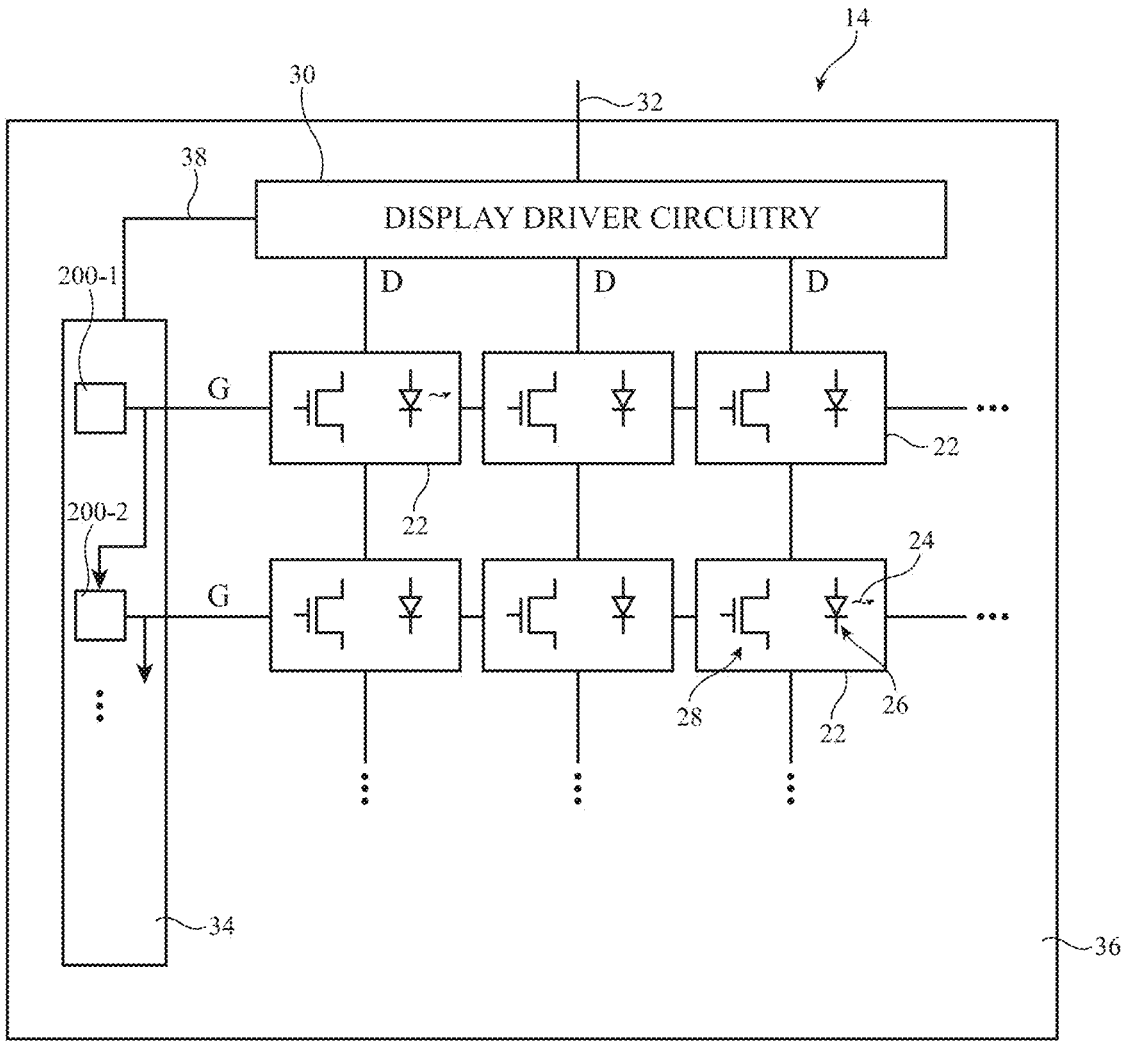
FIG. 2 is a diagram of an illustrative display having an array of organic light-emitting diode display pixels in accordance with some embodiments.

A top view of a portion of display 14 is shown in FIG. 2. As shown in FIG. 2, display 14 may have an array of pixels 22 formed on a substrate 36. Substrate 36 may be formed from glass, metal, plastic, ceramic, porcelain, or other substrate materials. Pixels 22 may receive data signals over signal paths such as data lines D (sometimes referred to as data signal lines, column lines, etc.) and may receive one or more control signals over control signal paths such as horizontal control lines G (sometimes referred to as gate lines, scan lines, emission lines, row lines, etc.). There may be any suitable number of rows and columns of pixels 22 in display 14 (e.g., tens or more, hundreds or more, or thousands or more).

Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry 30 may be used to control the operation of pixels 22. The display driver circuitry 30 may be formed from integrated circuits, thin-film transistor circuits, or other suitable electronic circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D (e.g., data lines that run down the columns of pixels 22) while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14 (e.g., the gate driver circuitry may be formed on more than one side of the display pixel array).

Gate driver circuitry 34 (sometimes referred to as horizontal line control circuitry or row driver circuitry) may be implemented as part of an integrated circuit and/or may be implemented using thin-film transistor circuitry. Horizontal/row control lines G in display 14 may carry gate line signals (scan line control signals), emission enable control signals, and/or other horizontal control signals for controlling the pixels of each row. There may be any suitable number of horizontal control signals per row of pixels 22 (e.g., one or more row control lines, two or more row control lines, three or more row control lines, four or more row control lines, five or more row control lines, etc.). Gate driver circuitry 34 may include multiple gate driver circuits (e.g., gate drivers 200-1, 200-2, and so on) connected in a chain. For example, each gate driver may be configured to generate one or more scan signals, one or more emission signals, and/or carry signals that are fed forward to a succeeding gate driver in the chain or that are fed back to a preceding gate driver in the chain.

In accordance with some embodiments, pixels 22 and gate driver circuitry 34 may be implemented using thin-film transistors such as semiconducting oxide transistors. Semiconducting oxide transistors can refer to and be defined herein as thin-film transistors having a channel region formed from semiconducting oxide material (e.g., indium gallium zinc oxide or IGZO, indium tin zinc oxide or ITZO, indium gallium tin zinc oxide or IGTZO, indium tin oxide or ITO, or other semiconducting oxide material) and are generally considered n-type (n-channel) transistors.

A semiconducting oxide transistor is notably different than a silicon transistor (i.e., a transistor having a polysilicon channel region deposited using a low temperature process sometimes referred to as LTPS or low-temperature polysilicon). Semiconducting oxide transistors exhibit lower leakage than silicon transistors, so implementing at least some of the transistors within pixel 22 can help reduce flicker (e.g., by preventing current from leaking away from the gate terminal of a drive transistor within pixel 22). In accordance with some embodiments, pixels 22 and gate driver circuitry 34 may be formed using only semiconducting oxide transistors (i.e., gate driver circuitry 34 and/or display 14 do not include any silicon transistors).

In other suitable embodiments, at least some of the transistors within pixel 22 and/or gate driver circuitry 34 may be implemented as silicon transistors such that pixel 22 and/or gate driver circuitry 34 includes a combination of semiconducting oxide transistors and silicon transistors (e.g., n-type LTPS transistors or p-type LTPS transistors).

Different transistors within display 14 may require different device characteristics for optimal display performance and operation. For instance, transistors that are predominantly in the off state may require more negative-bias-temperature-stress (NBTS) stability. As another example, transistors that are predominantly in the on state may require more positive-bias-temperature-stress (PBTS) stability. At least some transistors within gate driver circuitry 34 may benefit from better PBTS and higher mobility for enhance drive-ability. To satisfy these different requirements, display 14 may be formed using semiconducting oxide transistors with different device characteristics. To provide semiconducting oxide transistors with different device characteristics, multiple layers of semiconducting oxide material may be formed at different processing steps.

Figure 3:
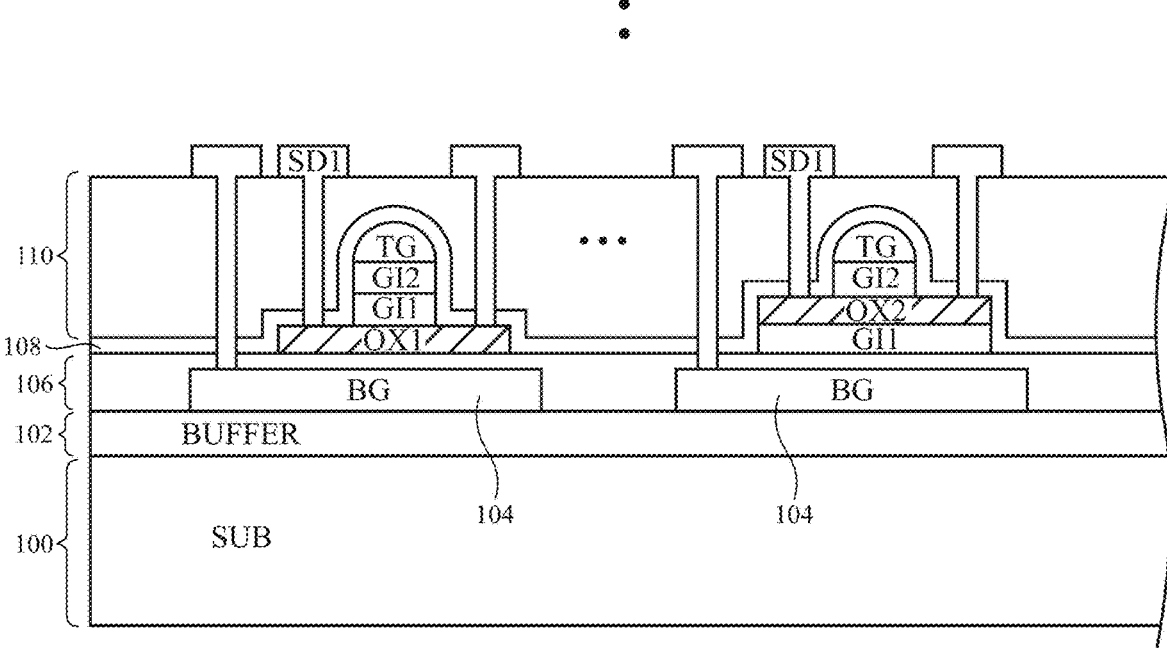
FIG. 3 is a cross-sectional side view of an illustrative display having semiconducting oxide transistors with top and bottom gate conductors in accordance with some embodiments.

FIG. 3 is a cross-sectional side view of display 14 having at least two different semiconducting oxide layers (e.g., semiconducting oxide layers formed at different processing steps using different materials or optionally using the same material). A semiconducting oxide layer can be defined as an oxide layer that is formed from a semiconductor such as IGZO, IGTZO, ITO, ITZO, or other semiconductor material. As shown in FIG. 3, display 14 may have a display stackup that includes a substrate layer such as substrate 100. Substrate 100 may optionally be covered with one or more buffer layers 102. Buffer layer(s) 102 may include inorganic buffer layers such as layers of silicon oxide, silicon nitride, or other passivation or dielectric material.

A conductive layer such as metal layer 104 may be formed on buffer layer 102. Conductive layer 104 may be a blanket layer when initially deposited on layer 102. Conductive layer 104 may be patterned to form respective metal shielding or bottom gate conductors for respective semiconducting oxide transistors such as Toxide1 and Toxide2. Metal layer 104 may be formed using molybdenum, aluminum, nickel, chromium, copper, titanium, silver, gold, a combination of these materials, other metals, or other suitable conductive material. Metal layer 104 may optionally serve as a bottom shielding layer (e.g., a shielding layer configured to block potentially interfering electromagnetic fields and/or light). Metal layer 104 can also serve as a bottom gate conductor for one or more semiconducting oxide transistors (e.g., semiconducting oxide transistors Toxide1 and Toxide2). A buffer insulating layer such as buffer insulating layer 106 may be formed over metal layer 104 and on buffer layer 102. Buffer insulating layer 106 (sometimes referred to as a second buffer layer) may be formed from silicon oxide, silicon nitride, or other passivation or insulating material.

A first oxide layer OX1 may be formed on insulating layer 106. Oxide layer OX1 is formed from semiconductor material. A first gate insulating layer GI1 may be formed over first oxide layer OX1. A second oxide layer OX2 may be formed on first gate insulating layer GI1. Oxide layer OX2 is also formed from semiconductor material. Second oxide layer OX2 may be formed over first oxide layer OX1. Semiconducting oxide layers OX1 and OX2 may be formed from the same or different semiconducting oxide materials. Oxide layers OX1 and OX2 may be blanket layers when first deposited. Oxide layer OX1 may be patterned to formed respective portions of first semiconducting oxide transistors (e.g., a portion of oxide layer OX1 is patterned to form the active region of transistor Toxide1). Oxide layer OX2 may be patterned to formed respective portions of second semiconducting oxide transistors (e.g., a portion of oxide layer OX2 is patterned to form the active region of transistor Toxide2).

A second gate insulating layer GI2 (which is formed separately from GI1) may be formed over second oxide layer OX2. Gate insulating layers GI1 and GI2 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Gate insulating layers GI1 and GI2 may be blanket layers when first deposited. A first portion of layer GI1 may be patterned in between layer OX1 and the gate conductor of Toxide1, whereas a second portion of layer GI1 may be patterned under layer OX2 of Toxide2. A first portion of layer GI2 may be patterned in between layer OX1 and the top gate terminal of Toxide1, whereas a second portion of layer GI2 may be patterned in between layer OX2 and the gate conductor of Toxide2. A top gate conductive layer such as gate layer OG may be formed on second gate insulating layer GI2. Top gate conductor(s) OG may be formed from molybdenum, titanium, aluminum, nickel, chromium, copper, silver, gold, a combination of these materials, other metals, or other suitable gate conductor material. The top and bottom gate conductors of a semiconducting oxide transistor are sometimes referred to as upper and lower gate conductors (terminals).

In the example of FIG. 3, semiconducting oxide transistor Toxide1 includes channel and source-drain active regions formed using first semiconducting oxide layer OX1, whereas semiconducting oxide transistor Toxide2 includes channel and source-drain active regions formed using second semiconducting oxide layer OX2. Semiconducting oxide transistor Toxide1 has gate insulating layers GI1 and GI2 separating oxide layer OX1 from its gate conductor OG. Semiconducting oxide transistor Toxide2 has only gate insulating layer GI2 separating oxide layer OX2 from its gate conductor OG. Thus, the overall gate insulator of Toxide1 is thicker than the gate insulator of Toxide2. This difference in the overall thickness and composition of the gate insulating layer can be used to provide different device characteristics between transistor Toxide1 and Toxide2. Gate insulating layer GI1 may be formed using the same or different material as gate insulating layer GI2. In the scenario where conductors 104 also serve as bottom gate conductors, the bottom gate insulator thickness of transistor Toxide1 will be determined by the thickness of layer 106, whereas the bottom gate insulator thickness of transistor Toxide2 will be determined by the combined thickness of layers 106 and GI1. This difference in gate insulator thickness above and below the semiconducting oxide active region can be used to achieve different device characteristics.

In general, transistor Toxide1 and transistor Toxide2 may represent any semiconducting oxide transistor within display 14. As an example, transistor Toxide1 may be designed to provide improved reliability by using IGZO, whereas transistor Toxide2 may be designed to provide improved mobility by using IGZTO. The use of at least two different semiconducting oxide transistors is not limited to only the active display area but can also be extended to the gate driver circuits and other peripheral display control circuits. Using different types of semiconducting oxide transistors across different areas of display 14 can enable high performance while also reducing panel border.

Still referring to FIG. 3, a first interlayer dielectric (ILD1) layer 108 may be formed over the OG conductor. A second interlayer dielectric (ILD2) layer 110 may be formed on ILD1 layer 108. The ILD layers 108 and 110 may be formed from silicon oxide, silicon nitride, silicon oxynitride, tantalum oxide, cerium oxide, carbon-doped oxide, aluminum oxide, hafnium oxide, titanium oxide, vanadium oxide, spin-on organic polymeric dielectrics, spin-on silicon based polymeric dielectric, a combination of these materials, and other suitable low-k or high-k solid insulating material. Layers 108 and 110 may be formed from the same or different material.

A first source-drain metal routing layer SD1 may be formed on layer 110. The SD1 metal routing layer may be formed from aluminum, nickel, chromium, copper, molybdenum, titanium, silver, gold, a combination of these materials (e.g., a multilayer stackup of Ti/Al/Ti), other metals, or other suitable metal routing conductors. The SD1 metal routing layer may be patterned and/or etch to form SD1 metal routing paths.

As shown in FIG. 3, some of the SD1 metal routing paths may be coupled using vertical via(s) to one or more source-drain regions associated with transistor Toxide1 and to one or more source-drain regions associated with transistor Toxide2. Some of the SD1 metal routing paths may optionally be coupled to the bottom conductive layer 104 (see dotted structures in FIG. 3).

A planarization (PLN) layer such as layer 112 may be formed over the SD1 metal routing layer. Planarization layer 112 may be formed from organic dielectric materials such as polymer. An anode layer including an anode conductor 114 forming the anode terminal of the organic light-emitting diode 26 may be formed on planarization layer 112. Anode conductor 114 may be coupled to at least some of the SD1 metal routing paths using vertical via(s) 120 formed through planarization layer 112. Additional structures may be formed over the anode layer. For example, a pixel definition layer, a spacer structure, organic light-emitting diode emissive material, a cathode layer, and other pixel structures may also be included in the stackup of display pixel 22. However, these additional structures are omitted for the sake of clarity and brevity.

Conventional gate drivers typically include only semiconducting oxide transistors with top gate control (i.e., only the top gate conductor of any semiconducting oxide transistor in the display can be adjusted). It can be challenging to design gate driver circuits under such constraints.

Figure 4:
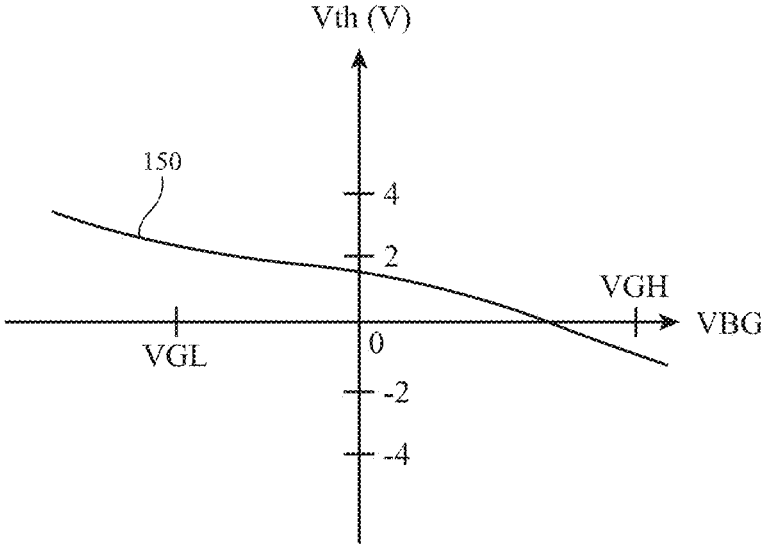
FIG. 4 is a plot showing how a semiconducting oxide transistor threshold voltage can vary as a function of bottom gate voltage in accordance with some embodiments.

In accordance with some embodiments, gate driver circuitry 34 may be provided with semiconducting oxide transistors at least some of which has separately controllable bottom gates for adjusting the threshold voltage of those transistors and for reducing leakage. FIG. 4 is a plot showing how semiconducting oxide transistor threshold voltage Vth can vary as a function of the bottom gate voltage VBG (e.g., an adjustable voltage that is applied to bottom gate conductor 104 in FIG. 3). Bottom gate voltage VBG is sometimes referred to as the back gate voltage. As shown by curve 150 in FIG. 4, threshold voltage Vth can have a positive value when VBG is equal to or less than ground power supply voltage VGL and can have a negative value when VBG is equal to a positive power supply voltage VGH. Ground power supply voltage VGL may be −2 V, −4, −6V, less than −8 V, −10V, −12V, 0V, or any suitable ground or negative power supply voltage level. Positive power supply voltage VGH may be 3 V, 4 V, 5 V, 6 V, 7 V, 2 to 8 V, 10V, 12V, 14V, 10-20 V, or any suitable positive power supply voltage level.

A lower VBG value corresponds to a positive Vth value for the top gate conductor. A semiconducting oxide transistor operating in such state is sometimes referred to as operating in an "enhance" or "enhancement" mode, which tends to provide operational stability and even lower leakage. In contrast, a higher VBG value corresponds to a negative Vth value with respect to the top gate conductor. A semiconducting oxide transistor operating in such state is sometimes referred to as operating in a "depletion" mode, which tends to provide higher drive current and may thus be suitable for discharging internal nodes within a gate driver circuit.

Figure 5:
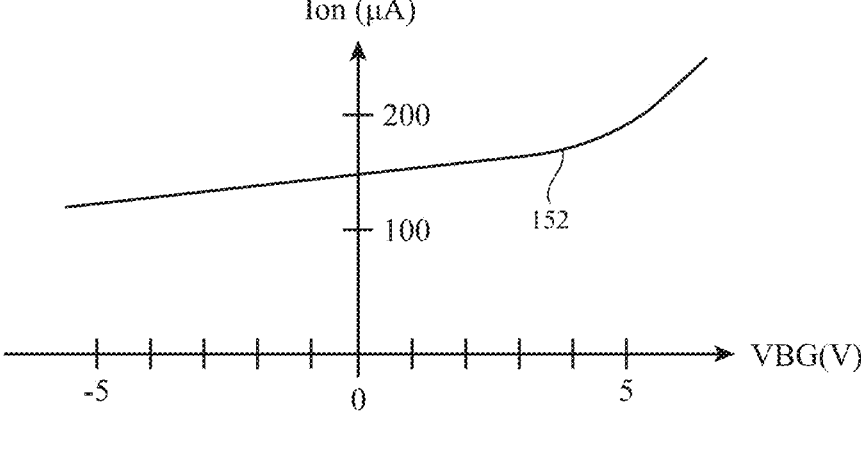
FIG. 5 is a plot showing how an on state current of a semiconducting oxide transistor can vary as a function of bottom gate voltage in accordance with some embodiments.

FIG. 5 is a plot showing how an on state current of a semiconducting oxide transistor can vary as a function of bottom gate voltage VBG. As shown by curve 152 in FIG. 5, a lower VBG value corresponds to a lower on current, whereas a higher VBG value corresponds to a higher on current. This result is consistent with FIG. 4 since a higher Vth value at lower VBG levels will reduce the on current while a lower Vth value at higher VBG levels will increase the on current.

Figure 6:
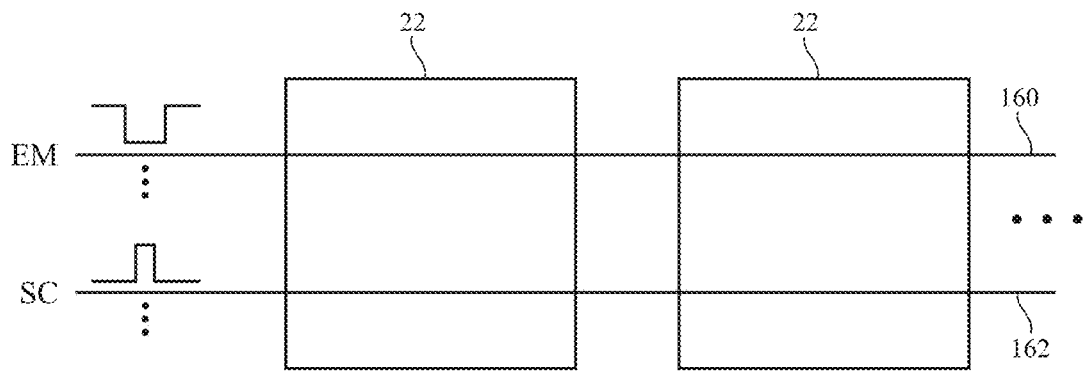
FIG. 6 is a diagram showing how emission and scan control signals can be provided to a row of display pixels in accordance with some embodiments.

FIG. 6 is a diagram showing how emission and scan control signals can be provided to a row of display pixels 22 in accordance with some embodiments. As shown in FIG. 6, one or more emission (control) signals EM can be provided over one or more emission lines 160 to a row of pixels 22. Similarly, one or more scan (control) signals SC can be provided over one or more scan lines 162 to a row of pixels 22. In the example of FIG. 6, the emission signals EM may be "active low" signals (e.g., signals that are normally at high voltages and are periodically driven low to turn on corresponding emission transistors in pixels 22), whereas the scan signals SC may be "active high" signals (e.g., signals that are normally at low voltages and are driven high to turn on corresponding switching transistors in pixels 22). Scan signals SC generally have smaller pulse widths than the emission signals EM, but this need not always be the case. Since the scan signals SC and the emission signals EM exhibit different active polarities and different pulse widths, the performance and power requirements for the driver circuitry driving these signals will be different. The example of FIG. 6 in which the EM signals are active low signals and the SC signals are active high signals is illustrative. In other embodiments, the emission signals EM can be active high signals and/or the scan signals SC can be active low signals. Device configurations in which the EM signals are active low signals and the SC signals are active high signals are sometimes described herein as an example.

Figure 7:
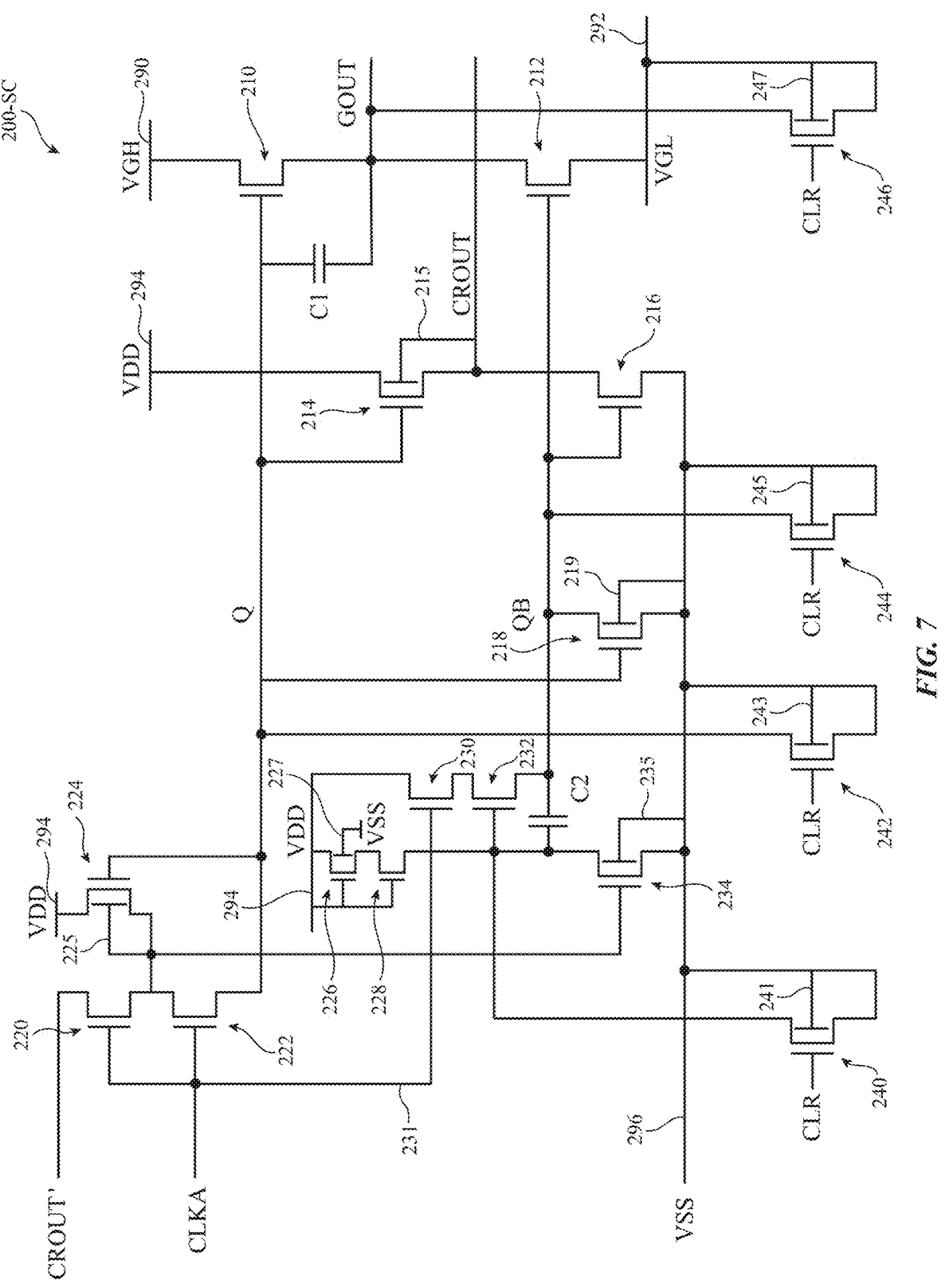
FIG. 7 is a circuit diagram of an illustrative scan driver circuit in accordance with some embodiments.

FIG. 7 is a circuit diagram of an illustrative implementation of a gate driver circuit such as a scan driver circuit 200-SC configured to output a scan signal. As shown in 7, gate driver circuit 200-SC may include capacitors C1 and C2, semiconducting oxide transistors 210, 212, 214, 216, 218, 220, 222, 224, 226, 228, 230, 232, 234, and associated discharge transistors 240, 242, 244, and 246 (also semiconducting oxide transistors). All of the transistors within gate driver circuit 200-SC can be semiconducting oxide transistors (as an example).

Transistor 210 may have a drain terminal coupled to a positive power supply line 290 (e.g., a power supply terminal on which positive power supply voltage VGH is provided), a gate terminal coupled to a node Q, and a source terminal coupled to a gate driver output port on which a corresponding gate output signal GOUT is generated. Gate output signal GOUT can represent a scan signal or alternatively an emission signal. The terms "source" and "drain" terminals that are used to describe current-conducting terminals of a transistor are sometimes interchangeable and may sometimes be referred to herein as "source-drain" terminals. For instance, the drain terminal of transistor 210 can be referred to as a first source-drain terminal, whereas the source terminal of transistor 210 can be referred to as a second source-drain terminal, or vice versa. Capacitor C1 can be coupled across the gate and source terminals of transistor 210.

Transistor 212 may have a drain terminal coupled to the gate driver output port, a gate terminal coupled to node QB, and a source terminal coupled to power supply line 292 (e.g., a power supply terminal on which low power supply voltage VGL is provided). The voltage on node QB is generally inverted with respect to the voltage on node Q. Voltage VGL is less than voltage VGH (see, e.g., FIG. 4). Power supply line 292 is sometimes referred to as a ground power supply line, a ground line, or a low voltage line. Transistors 210 and 212 that are directly coupled to the gate driver output port are sometimes referred to collectively as output transistors.

Transistor 214 may have a gate terminal coupled to node Q, a drain terminal coupled to positive power supply line 294 (e.g., a power supply terminal on which positive power supply voltage VDD is provided), and a source terminal coupled to a carry output port on which a carry output signal CROUT is generated. Power supply voltage VDD may be greater than, less than, or equal to VGH. Transistor 216 may have a drain terminal coupled to the carry output port, a gate terminal coupled to node QB, and a source terminal coupled to a ground power supply line 296 (e.g., a power supply terminal on which ground power supply voltage VSS is provided). Power supply line 296 is sometimes referred to as a ground line or a low voltage line. Ground voltage VSS may be greater than, less than, or equal to VGL. Transistor 218 may have a gate terminal coupled to node Q, a drain terminal coupled to node QB, and a source terminal coupled to ground line 296.

Transistor 220 may have a first source-drain terminal configured to receive a carry output signal CROUT' from another gate driver circuit of another row, a gate terminal configured to receive a clock signal CLKA, and a second source-drain terminal. Transistor 222 may have a first source-drain terminal coupled to the second source-drain terminal of transistor 220, a gate terminal configured to receive clock signal CLKA, and a second source-drain terminal coupled to node Q. Transistor 224 may have a drain terminal coupled to power supply line 294, a source terminal coupled to a node interposed between transistors 220 and 222, and a gate terminal coupled to node Q.

Transistor 226 may have a drain terminal coupled to the VDD power supply line 294, a gate terminal also coupled to VDD power supply line 226, and a source terminal. Transistor 228 may have a drain terminal coupled to the source terminal of transistor 226, a gate terminal coupled to the VDD power supply line 294, and a source terminal. Transistor 234 may have a drain terminal coupled to the source terminal of transistor 228, a gate terminal coupled to the node interposed between transistors 220 and 222, and a source terminal coupled to the VSS ground line 296.

Transistor 230 may have a drain terminal coupled to the VDD power supply line 294, a gate terminal configured to receive clock signal CLKA via signal path 231, and a source terminal. Controlling transistors 220, 230, and 230 using clock signal CLKA can help save power. Transistor 232 may have a drain terminal coupled to the source terminal of transistor 230, a gate terminal coupled to the drain terminal of transistor 234, and a source terminal coupled to node QB. Capacitor C2 may be coupled between the drain terminal of transistor 234 and node QB. Having capacitor C2 coupled across transistor 232 can help bootstrap node QB to make driver 200-SC work properly even under extreme threshold voltage shifts.

The discharge transistors can be used to discharge one or more internal nodes within gate driver circuit 200-SC during a power down or reset sequence. Discharge transistor 240 may have a drain terminal coupled to the drain terminal of transistor 234, a source terminal coupled to the VSS ground line 296, and a gate terminal configured to receive a clear signal CLR. Discharge transistor 242 may have a drain terminal coupled to node Q, a source terminal coupled to the VSS ground line 296, and a gate terminal configured to receive signal CLR. Discharge transistor 244 may have a drain terminal coupled to node QB, a source terminal coupled to the VSS ground line 296, and a gate terminal configured to receive signal CLR. Discharge transistor 246 may have a drain terminal coupled to the gate driver output port, a source terminal coupled to the VGL ground line 292, and a gate terminal configured to receive signal CLR. The clear signal CLR can be asserted (e.g., driven high) during a power down sequence to activate the discharge transistors to pull down the respective internal nodes within driver circuit 200-SC.

If care is not taken, semiconducting oxide transistors can tend to exhibit negative threshold voltages, which can result in elevated levels of leakage, reliability issues, and excessive power consumption. In accordance with some embodiments, at least some of the transistors within gate driver 200-SC can be implemented as semiconducting oxide transistors with back or bottom gate conductors (see, e.g., back/bottom gate conductors 104 in FIG. 3). In the example of FIG. 7, transistor 214 may have a bottom gate conductor or terminal coupled to its source terminal (see connection 215). For transistors have a bottom gate terminal, the other gate conductor can be referred to as the top gate terminal.

As another example, transistor 218 may have a bottom gate terminal coupled to the VSS ground line 296 (see back gate connection 219). As another example, transistor 224 may have a bottom gate terminal coupled to its source terminal (see back gate connection 225). As another example, transistor 226 may have a bottom gate terminal coupled to the VSS ground line (see back gate connection 227). As another example, transistor 234 may have a bottom gate terminal coupled to the VSS ground line (see back gate connection 235). As another example, discharge transistor 240 may have a bottom gate terminal coupled to the VSS ground line 296 (see back gate connection 241). As another example, discharge transistor 242 may have a bottom gate terminal coupled to the VSS ground line 296 (see back gate connection 243). As another example, discharge transistor 244 may have a bottom gate terminal coupled to the VSS ground line 296 (see back gate connection 245). As another example, discharge transistor 246 may have a bottom gate terminal coupled to the VGL ground line 292 (see back gate connection 247). Having bottom gate connections configured in this way can be technically advantageous and beneficial to reduce leakage and power consumption while allowing gate driver 200-SC to tolerate negative threshold voltages.

Figure 8A:
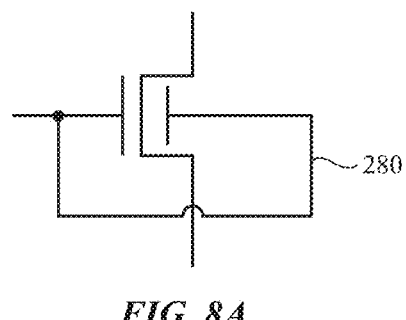
FIGS. 8A-8F are diagrams showing various configurations of an illustrative semiconducting oxide transistor in accordance with some embodiments.
Figure 8B:
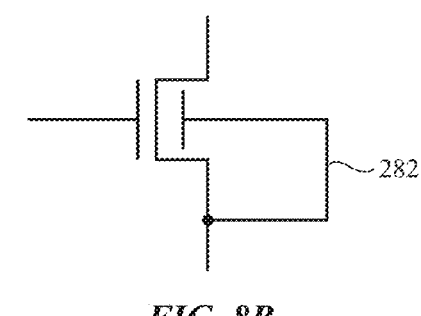
Figure 8C:
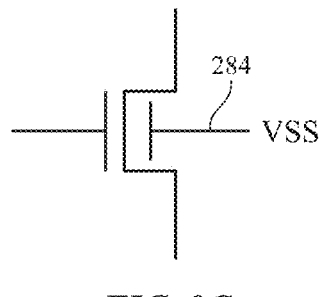

If desired, any of the transistors within gate driver 200-SC can be provided with a bottom gate conductor. Each transistor within gate driver 200-SC can be implemented using one of the configurations shown in FIGS. 8A-8F. FIG. 8A shows how the bottom gate terminal of a semiconducting oxide transistor can be shorted to the top (front) gate terminal via connection 280. FIG. 8B shows another arrangement in which the bottom gate terminal of a semiconducting oxide transistor is shorted to its source terminal via connection 282. FIG. 8C shows another arrangement in which the bottom gate terminal of a semiconducting oxide transistor is shorted to the VSS ground line via connection 284. As another example, the bottom gate terminal of a semiconducting oxide transistor can be shorted to the VGL or other ground line.

Figure 8D:
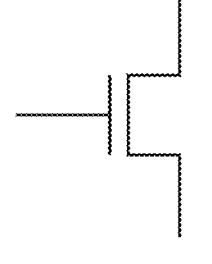
Figure 8E:
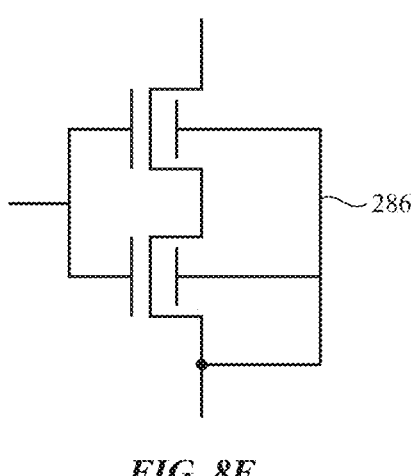
Figure 8F:
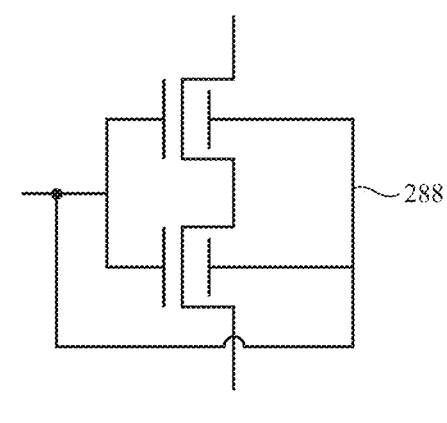

FIG. 8D shows another arrangement in which a semiconducting oxide transistor does not have any bottom gate conductor. FIG. 8E shows another arrangement of a semiconducting oxide transistor that is structurally implemented as two series-connected transistors with their top gate terminals shorted together and with their bottom gate terminals shorted to a common source terminal (see back gate connection 286). FIG. 8F shows another arrangement of a semiconducting oxide transistor that is structurally implemented as two series-connected transistors with their top gate terminals shorted together and with their bottom gate terminals shorted to the top gate terminals (see back gate connection 288).

Figure 9:
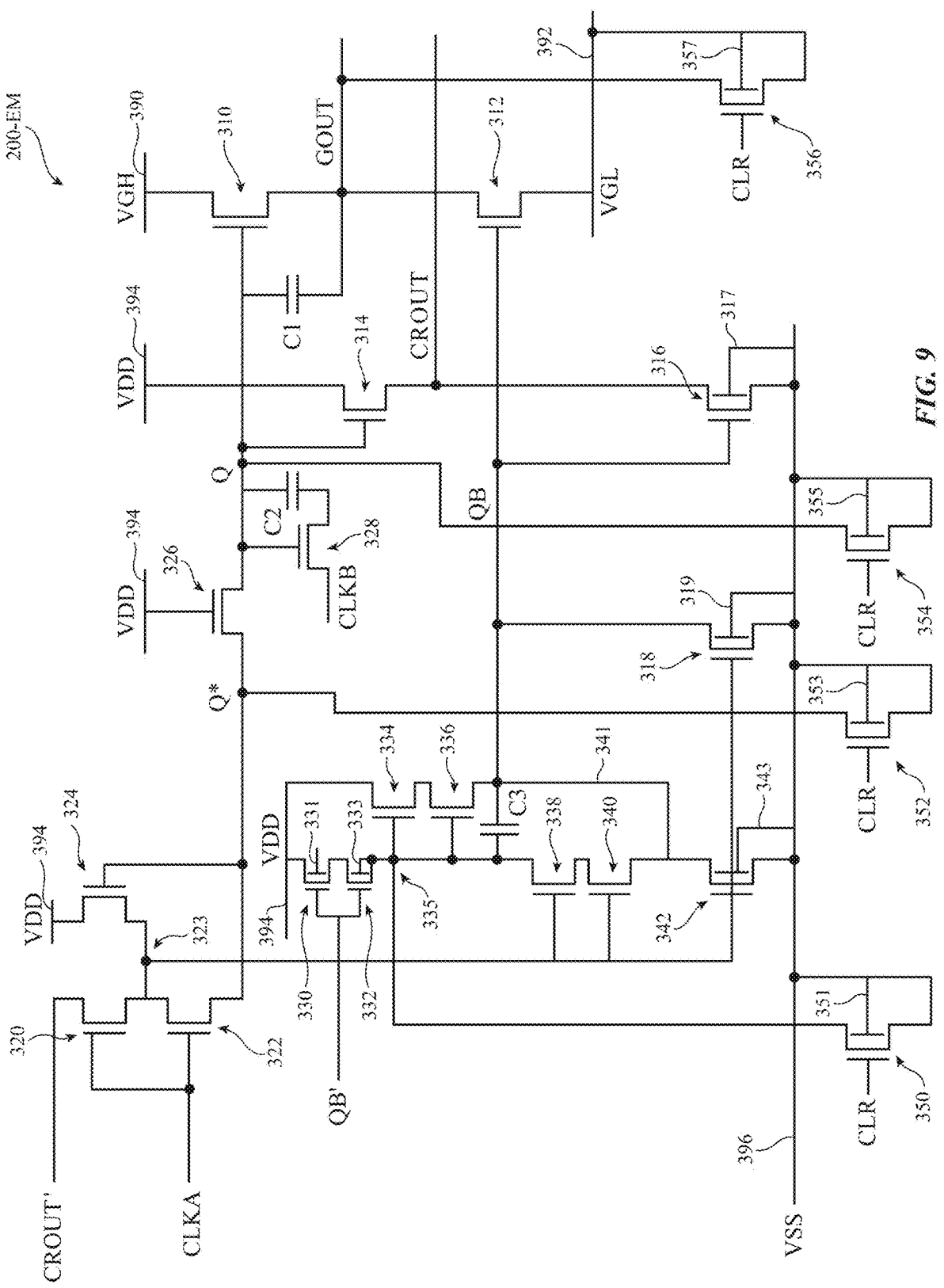
FIGS. 9 and 10 are circuit diagrams of illustrative emission driver circuits in accordance with some embodiments.

The embodiment of scan driver circuit 200-SC as shown in FIG. 7 is illustrative. FIG. 9 is a circuit diagram showing an embodiment of another gate driver circuit such as emission driver circuit 200-EM configured to output an emission signal. As shown in 9, gate driver circuit 200-EM may include capacitors C1, C2, and C3, semiconducting oxide transistors 310, 312, 314, 316, 318, 320, 322, 324, 326, 328, 330, 332, 334, 336, 338, 340, and 342, and associated discharge transistors 350, 352, 354, and 356 (also semiconducting oxide transistors). All of the transistors within gate driver circuit 200-EM can be semiconducting oxide transistors (as an example).

Transistor 310 may have a drain terminal coupled to a positive power supply line 390 (e.g., a power supply terminal on which positive power supply voltage VGH is provided), a gate terminal coupled to a node Q, and a source terminal coupled to a gate driver output port on which a corresponding gate output signal GOUT is generated. Gate output signal GOUT can represent an emission signal or alternatively a scan signal. Capacitor C1 can be coupled across the gate and source terminals of transistor 310. Transistor 312 may have a drain terminal coupled to the gate driver output port, a gate terminal coupled to node QB, and a source terminal coupled to power supply line 392 (e.g., a power supply terminal on which low power supply voltage VGL is provided). The voltage on node QB is generally inverted with respect to the voltage on node Q. Voltage VGL is less than voltage VGH (see, e.g., FIG. 4). Power supply line 392 is sometimes referred to as a ground power supply line, a ground line, or a low voltage line. Transistors 310 and 312 that are directly coupled to the gate driver output port are sometimes referred to collectively as output transistors.

Transistor 314 may have a gate terminal coupled to node Q, a drain terminal coupled to positive power supply line 394 (e.g., a power supply terminal on which positive power supply voltage VDD is provided), and a source terminal coupled to a carry output port on which a carry output signal CROUT is generated. Power supply voltage VDD may be greater than, less than, or equal to VGH. Transistor 316 may have a drain terminal coupled to the carry output port, a gate terminal coupled to node QB, and a source terminal coupled to a ground power supply line 396 (e.g., a power supply terminal on which ground power supply voltage VSS is provided). Power supply line 396 is sometimes referred to as a VSS ground line or a low voltage line. Ground voltage VSS may be greater than, less than, or equal to VGL.

Transistor 318 may have a gate terminal coupled to a node 323 interposed between transistors 320 and 322, a drain terminal coupled to node QB, and a source terminal coupled to ground line 396.

Transistor 320 may have a first source-drain terminal configured to receive a carry output signal CROUT' from another gate driver circuit of another row, a gate terminal configured to receive a clock signal CLKA, and a second source-drain terminal. Transistor 322 may have a first source-drain terminal coupled to the second source-drain terminal of transistor 320, a gate terminal configured to receive clock signal CLKA, and a second source-drain terminal coupled to a node Q*. Transistor 324 may have a drain terminal coupled to the VDD power supply line 394, a source terminal coupled to node 323 interposed between transistors 320 and 322, and a gate terminal coupled to node Q*.

Transistor 326 may have a first source-drain terminal coupled to node Q, a second source-drain terminal coupled to node Q*, and a gate terminal coupled to the VDD power supply line 394. Transistor 328 may have a gate terminal coupled to node Q, a first source-drain terminal coupled to node Q via capacitor C2, and a second source-drain terminal configured to receive another clock signal CLKB. Coupling clock signal CLKB to node Q via capacitor C3 can help reduce stress within gate driver 200-EM.

Transistor 330 may have a drain terminal coupled to the VDD power supply line 394, a gate terminal coupled to the QB node of a gate driver in another row (labeled in FIG. 9 as QB'), and a source terminal. Transistor 332 may have a drain terminal coupled to the source terminal of transistor 330, a gate terminal coupled to node QB', and a source terminal that is coupled to node 335. Transistor 334 may have a drain terminal coupled to the VDD power supply line 394, a gate terminal coupled to node 335, and a source terminal. Transistor 336 may have a drain terminal coupled to the source terminal of transistor 334, a gate terminal coupled to node 335, and a source terminal coupled to node QB. Capacitor C2 may be coupled across the gate and source terminals of transistor 336.

Transistor 338 may have a drain terminal coupled to node 335, a gate terminal coupled to node 323, and a source terminal. Transistor 340 may have a drain terminal coupled to the source terminal of transistor 338, a gate terminal coupled to node 323, and a source terminal coupled to node QB via path 341. Transistor 342 may have a drain terminal coupled to node QB via path 341, a gate terminal coupled to node 323, and a source terminal coupled to the VSS ground line 396. Having capacitor C3 coupled across transistor 336 can help bootstrap node QB to make driver 200-EM work properly even under extreme threshold voltage shifts.

The discharge transistors can be used to discharge one or more internal nodes within gate driver circuit 200-EM during a power down or reset sequence. Discharge transistor 350 may have a drain terminal coupled to node 335, a source terminal coupled to the VSS ground line 396, and a gate terminal configured to receive a clear signal CLR. Discharge transistor 352 may have a drain terminal coupled to node Q*, a source terminal coupled to the VSS ground line 396, and a gate terminal configured to receive signal CLR. Discharge transistor 354 may have a drain terminal coupled to node Q, a source terminal coupled to the VSS ground line 396, and a gate terminal configured to receive signal CLR. Discharge transistor 356 may have a drain terminal coupled to the gate driver output port, a source terminal coupled to the VGL ground line 392, and a gate terminal configured to receive signal CLR. The clear signal CLR can be asserted (e.g., driven high) during a power down or reset sequence to activate the discharge transistors to pull down the respective internal nodes within driver circuit 200-EM.

If care is not taken, semiconducting oxide transistors can tend to exhibit negative threshold voltages, which can result in elevated levels of leakage, reliability issues, and excessive power consumption. In accordance with some embodiments, at least some of the transistors within gate driver 200-EM can be implemented as semiconducting oxide transistors with bottom gate conductors (see, e.g., bottom/back gate conductors 104 in FIG. 3). In the example of FIG. 9, transistor 330 may have a bottom gate conductor or terminal coupled to its source terminal or to the source terminal of transistor 332 (see connection 331).

As another example, transistor 332 may have a bottom gate terminal coupled to its source terminal (see back gate connection 333). As another example, transistor 342 may have a bottom gate terminal coupled to the VSS ground line 396 (see back gate connection 343). As another example, transistor 318 may have a bottom gate terminal coupled to the VSS ground line 396 (see back gate connection 319). As another example, transistor 316 may have a bottom gate terminal coupled to the VSS ground line 396 (see back gate connection 317). As another example, discharge transistor 350 may have a bottom gate terminal coupled to the VSS ground line 396 (see back gate connection 351). As another example, discharge transistor 352 may have a bottom gate terminal coupled to the VSS ground line 396 (see back gate connection 353). As another example, discharge transistor 354 may have a bottom gate terminal coupled to the VSS ground line 396 (see back gate connection 355). As another example, discharge transistor 356 may have a bottom gate terminal coupled to the VGL ground line 392 (see back gate connection 357). Having bottom gate connections configured in this way can be technically advantageous and beneficial to reduce leakage and power consumption while allowing gate driver 200-EM to tolerate negative threshold voltages.

The bottom gate configuration as shown in FIG. 9 is exemplary. If desired, any of the transistors within gate driver 200-EM can be provided with a bottom gate conductor. In general, each transistor within gate driver 200-EM can be implemented using one of the transistor configurations shown in FIGS. 8A-8F to help control leakage and/or threshold voltage.

Figure 10:
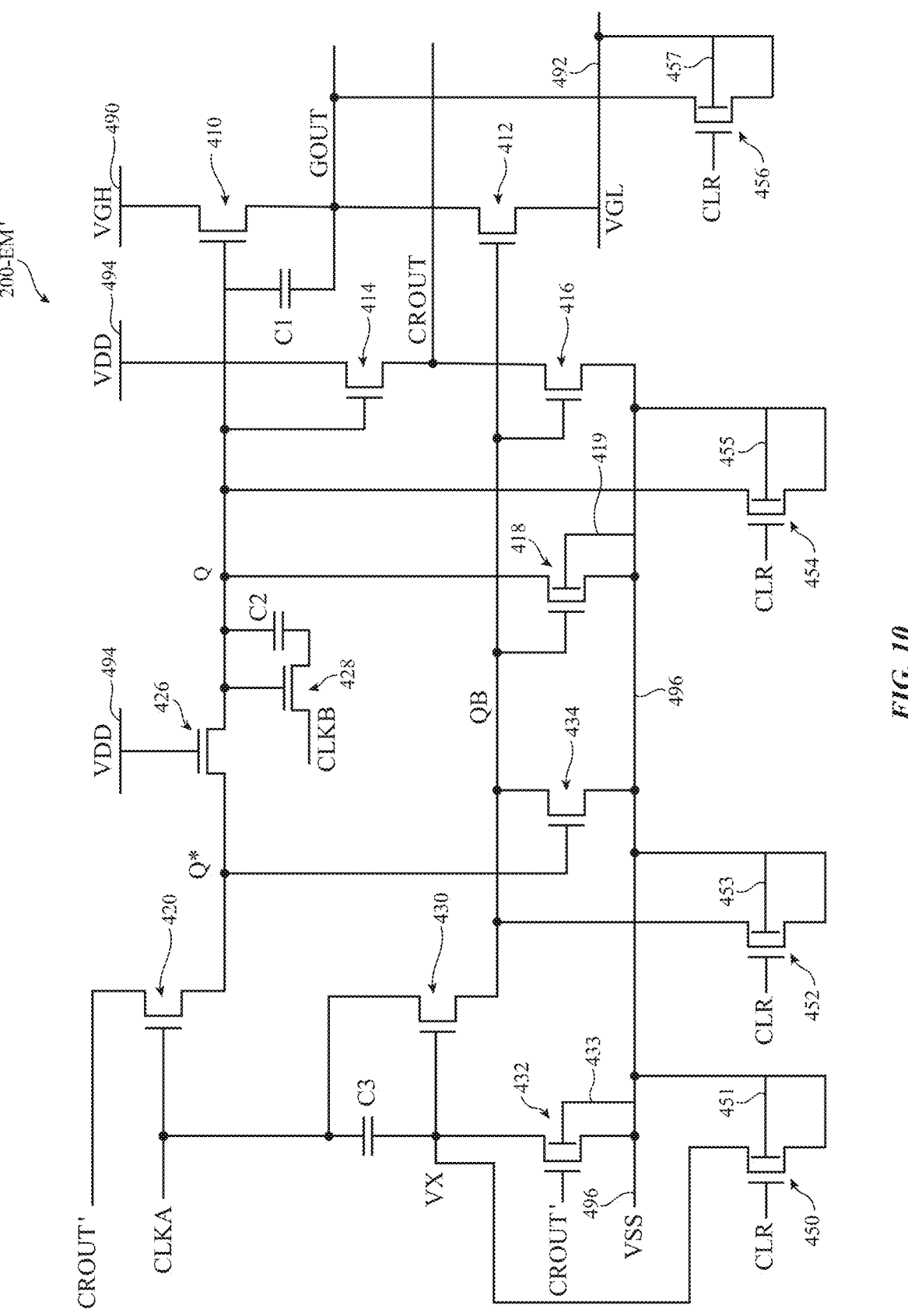

The embodiment of scan driver circuit 200-EM as shown in FIG. 9 is illustrative. FIG. 10 is a circuit diagram showing an embodiment of another gate driver circuit such as emission driver circuit 200-EM' configured to output an emission signal. As shown in 10, gate driver circuit 200-EM' may include capacitors C1, C2, and C3, semiconducting oxide transistors 410, 412, 414, 416, 418, 420, 426, 428, 430, 432, and 434, and associated discharge transistors 450, 452, 454, and 456 (also semiconducting oxide transistors). All of the transistors within gate driver circuit 200-EM' can be semiconducting oxide transistors (as an example).

Transistor 410 may have a drain terminal coupled to a positive power supply line 490 (e.g., a power supply terminal on which positive power supply voltage VGH is provided), a gate terminal coupled to a node Q, and a source terminal coupled to a gate driver output port on which a corresponding gate output signal GOUT is generated. Gate output signal GOUT can represent an emission signal or alternatively a scan signal. Capacitor C1 can be coupled across the gate and source terminals of transistor 410. Transistor 412 may have a drain terminal coupled to the gate driver output port, a gate terminal coupled to node QB, and a source terminal coupled to power supply line 492 (e.g., a power supply terminal on which low power supply voltage VGL is provided). The voltage on node QB is generally inverted with respect to the voltage on node Q. Voltage VGL is less than voltage VGH (see, e.g., FIG. 4). Power supply line 492 is sometimes referred to as a ground power supply line, a ground line, or a low voltage line. Transistors 410 and 412 that are directly coupled to the gate driver output port are sometimes referred to collectively as output transistors.

Transistor 414 may have a gate terminal coupled to node Q, a drain terminal coupled to positive power supply line 494 (e.g., a power supply terminal on which positive power supply voltage VDD is provided), and a source terminal coupled to a carry output port on which a carry output signal CROUT is generated. Power supply voltage VDD may be greater than, less than, or equal to VGH. Transistor 416 may have a drain terminal coupled to the carry output port, a gate terminal coupled to node QB, and a source terminal coupled to a ground power supply line 496 (e.g., a power supply terminal on which ground power supply voltage VSS is provided). Power supply line 496 is sometimes referred to as a VSS ground line or a low voltage line. Ground voltage VSS may be greater than, less than, or equal to VGL. Transistor 418 may have a gate terminal coupled to node QB, a drain terminal coupled to node Q, and a source terminal coupled to ground line 496.

Transistor 420 may have a first source-drain terminal configured to receive a carry output signal CROUT' from another gate driver circuit of another row, a gate terminal configured to receive a clock signal CLKA, and a second source-drain terminal coupled to node Q*. Transistor 426 may have a first source-drain terminal coupled to node Q, a second source-drain terminal coupled to node Q*, and a gate terminal coupled to the VDD power supply line 494. Transistor 428 may have a gate terminal coupled to node Q, a first source-drain terminal coupled to node Q via capacitor C2, and a second source-drain terminal configured to receive another clock signal CLKB. Coupling clock signal CLKB to node Q via capacitor C2 can help reduce stress within gate driver 200-EM'. Transistor 434 may have a gate terminal coupled to node Q*, a drain terminal coupled to node QB, and a source terminal coupled to the VSS ground line 496.

Transistor 430 may have a first source-drain terminal configured to receive clock signal CLKA, a second source-drain terminal coupled to node QB, and a gate terminal coupled to node VX. Capacitor C3 may be coupled across the first source-drain terminal and the gate terminal of transistor 430. Transistor 432 may have a drain terminal coupled to node VX, a gate terminal configured to receive a carry output signal CROUT' from the gate driver or another row, and a source terminal coupled to the VSS ground line 496.

The discharge transistors can be used to discharge one or more internal nodes within gate driver circuit 200-EM' during a power down or reset sequence. Discharge transistor 450 may have a drain terminal coupled to node VX, a source terminal coupled to the VSS ground line 496, and a gate terminal configured to receive a clear signal CLR. Discharge transistor 452 may have a drain terminal coupled to node QB, a source terminal coupled to the VSS ground line 496, and a gate terminal configured to receive signal CLR. Discharge transistor 454 may have a drain terminal coupled to node Q, a source terminal coupled to the VSS ground line 496, and a gate terminal configured to receive signal CLR. Discharge transistor 456 may have a drain terminal coupled to the gate driver output port, a source terminal coupled to the VGL ground line 492, and a gate terminal configured to receive signal CLR. The clear signal CLR can be asserted (e.g., driven high) during a power down or reset sequence to activate the discharge transistors to pull down the respective internal nodes within driver circuit 200-EM'.

If care is not taken, semiconducting oxide transistors can tend to exhibit negative threshold voltages, which can result in elevated levels of leakage, reliability issues, and excessive power consumption. In accordance with some embodiments, at least some of the transistors within gate driver 200-EM' can be implemented as semiconducting oxide transistors with bottom gate conductors (see, e.g., bottom/back gate conductors 104 in FIG. 3). In the example of FIG. 10, transistor 418 may have a bottom gate conductor or terminal coupled to the VSS ground line 496 (see connection 419).

As another example, transistor 432 may have a bottom gate terminal coupled to the VSS ground line 496 (see back gate connection 433). As another example, discharge transistor 450 may have a bottom gate terminal coupled to the VSS ground line 496 (see back gate connection 451). As another example, discharge transistor 452 may have a bottom gate terminal coupled to the VSS ground line 496 (see back gate connection 453). As another example, discharge transistor 454 may have a bottom gate terminal coupled to the VSS ground line 496 (see back gate connection 455). As another example, discharge transistor 456 may have a bottom gate terminal coupled to the VGL ground line 492 (see back gate connection 457). Having bottom gate connections configured in this way can be technically advantageous and beneficial to reduce leakage and power consumption while allowing gate driver 200-EM' to tolerate negative threshold voltages.

The bottom gate configuration as shown in FIG. 10 is exemplary. If desired, any of the transistors within gate driver 200-EM can be provided with a bottom gate conductor. In general, each transistor within gate driver 200-EM' can be implemented using one of the transistor configurations shown in FIGS. 8A-8F to help control leakage and/or threshold voltage.

The foregoing is merely illustrative and various modifications can be made to the described embodiments. The foregoing embodiments may be implemented individually or in any combination.

What is claimed is:

1. A driver circuit configured to output a control signal to a row of display pixels, comprising:

a first transistor having a drain terminal coupled to a first positive power supply line, a gate terminal, and a source terminal that is coupled to an output port of the driver circuit, the control signal being generated at the output port;

a second transistor having a drain terminal coupled to the output port of the driver circuit, a gate terminal, and a source terminal that is coupled to a first ground power supply line;

a third transistor having a drain terminal coupled to a second positive power supply line different than the first positive power supply line, a gate terminal coupled to the gate terminal of the first transistor, a source terminal on which a carry output signal is generated, and a bottom gate terminal shorted to its source terminal;

a fourth transistor having a drain terminal coupled to the source terminal of the third transistor, a gate terminal coupled to the gate terminal of the second transistor, and a source terminal coupled to a second ground power supply line different than the first ground power supply line; and a fifth transistor having a gate terminal coupled to the gate terminal of the first transistor, a drain terminal coupled to the gate terminal of the second transistor, a source terminal coupled to the second ground power supply line, and a bottom gate terminal coupled to the second ground power supply line.

2. The driver circuit of claim 1, further comprising:

a capacitor having a first terminal coupled to the gate terminal of the first transistor and having a second terminal coupled to the output port of the driver circuit.

3. The driver circuit of claim 1, further comprising:

a sixth transistor having a first source-drain terminal configured to receive a carry output signal from an additional driver circuit, a gate terminal configured to receive a clock signal, and a second source-drain terminal coupled to a first node;

a seventh transistor having a first source-drain terminal coupled to the first node, a gate terminal configured to receive the clock signal, and a second source-drain terminal coupled to the gate terminal of the first transistor; and an eighth transistor having a drain terminal coupled to the second positive power supply line, a gate terminal coupled to the gate terminal of the first transistor, a source terminal coupled to the first node, and a bottom gate terminal shorted to its source terminal.

4. The driver circuit of claim 3, further comprising:

a ninth transistor having a drain terminal coupled to the second positive power supply line, a gate terminal coupled to the second positive power supply line, a source terminal, and a bottom gate terminal coupled to the second ground power supply line;

a tenth transistor having a drain terminal coupled to the source terminal of the ninth transistor, a gate terminal coupled to the second positive power supply line, and a source terminal coupled to a second node;

an eleventh transistor having a drain terminal coupled to the second positive power supply line, a gate terminal configured to receive the clock signal, and a source terminal;

a twelfth transistor having a drain terminal coupled to the source terminal of the eleventh transistor, a gate terminal coupled to the second node, and a source terminal coupled to the gate terminal of the second transistor;

a capacitor coupled across the gate and source terminals of the twelfth transistor; and a thirteenth transistor having a drain terminal coupled to the second node, a gate terminal coupled to the first node, a source terminal coupled to the second ground power supply line, and a bottom gate terminal coupled to the second ground power supply line.

5. The driver circuit of claim 4, further comprising:

a first discharge transistor having a drain terminal coupled to the second node, a source terminal coupled to the second ground power supply line, a gate terminal configured to receive a clear signal, and a bottom gate terminal coupled to the second ground power supply line;

a second discharge transistor having a drain terminal coupled to the gate terminal of the first transistor, a source terminal coupled to the second ground power supply line, a gate terminal configured to receive the clear signal, and a bottom gate terminal coupled to the second ground power supply line;

a third discharge transistor having a drain terminal coupled to the gate terminal of the second transistor, a source terminal coupled to the second ground power supply line, a gate terminal configured to receive the clear signal, and a bottom gate terminal coupled to the second ground power supply line; and a fourth discharge transistor having a drain terminal coupled to the output port of the driver circuit, a source terminal coupled to the first ground power supply line, a gate terminal configured to receive the clear signal, and a bottom gate terminal coupled to the first ground power supply line.

6. A driver circuit configured to output a control signal to a row of display pixels, comprising:

a first transistor having a drain terminal coupled to a first positive power supply line, a gate terminal, and a source terminal that is coupled to an output port of the driver circuit, wherein the control signal is configured to be produced at the output port;

a second transistor having a drain terminal coupled to the output port of the driver circuit, a gate terminal, and a source terminal that is coupled to a first ground power supply line;

a third transistor having a drain terminal coupled to the gate terminal of the second transistor, a gate terminal coupled to the gate terminal of the first transistor, a source terminal coupled to a second ground power supply line different than the first ground power supply line, and a bottom gate terminal shorted to its source terminal;

a fourth transistor having a drain terminal coupled to the drain terminal of the third transistor, a source terminal coupled to the second ground power supply line, a gate terminal, and a bottom gate terminal shorted to its source terminal; and a first additional transistor having a gate terminal configured to receive a clock signal and a source-drain terminal coupled to the gate terminal of the fourth transistor.

7. The driver circuit of claim 6, further comprising:

a second additional transistor having a drain terminal coupled to a second positive power supply line different than the first positive power supply line, a gate terminal coupled to the gate terminal of the first transistor, a source terminal on which a carry output signal is generated, and a bottom gate terminal shorted to its source terminal.

8. The driver circuit of claim 6, further comprising:

a fifth transistor having a drain terminal coupled to a second positive power supply line different than the first positive power supply line, a gate terminal configured to receive the clock signal, and a source terminal;

a sixth transistor having a drain terminal coupled to the source terminal of the fifth transistor, a source terminal coupled to the gate terminal of the second transistor, and a gate terminal coupled to the drain terminal of the fourth transistor; and a capacitor having a first terminal coupled to the drain terminal of the fourth transistor and having a second terminal coupled to the source terminal of the sixth transistor.

9. The driver circuit of claim 6, further comprising:

a fifth transistor having a drain terminal coupled to a second positive power supply line different than the first positive power supply line, a gate terminal coupled to the second positive power supply line, a source terminal, and a bottom terminal coupled to the second ground power supply line; and a sixth transistor having a drain terminal coupled to the source terminal of the source terminal of the fifth transistor, a gate terminal shorted to the gate terminal of the fifth transistor, and a source terminal coupled to the drain terminal of the fourth transistor.

10. The driver circuit of claim 6, further comprising:

a first discharge transistor having a drain terminal coupled to the output port of the driver circuit, a source terminal coupled to the first ground power supply line, a gate terminal configured to receive a clear signal, and a bottom gate terminal coupled to the first ground power supply line.

11. The driver circuit of claim 10, further comprising:

a second discharge transistor having a drain terminal coupled to the gate terminal of the second transistor, a source terminal coupled to the second ground power supply line, a gate terminal configured to receive the clear signal, and a bottom gate terminal coupled to the second ground power supply line.

12. A driver circuit configured to output a control signal to a row of display pixels, comprising:

a first transistor having a drain terminal coupled to a first positive power supply line, a gate terminal, and a source terminal that is coupled to an output port of the driver circuit, wherein the control signal is configured to be produced at the output port;

a second transistor having a drain terminal coupled to the output port of the driver circuit, a gate terminal, and a source terminal that is coupled to a first ground power supply line;

a first discharge transistor having a drain terminal coupled to the output port of the driver circuit, a source terminal coupled to the first ground power supply line, a gate terminal configured to receive a clear signal, and a bottom gate terminal coupled to the first ground power supply line;

a capacitor having a first terminal coupled to the gate terminal of the second transistor and having a second terminal; and a second discharge transistor having a drain terminal coupled to the second terminal of the capacitor, a source terminal coupled to a second ground power supply line, a gate terminal configured to receive the clear signal, and a bottom gate terminal coupled to the second ground power supply line.

13. The driver circuit of claim 12, further comprising:

an additional transistor having a drain terminal coupled to a second positive power supply line different than the first positive power supply line, a gate terminal coupled to the gate terminal of the first transistor, a source terminal on which a carry output signal is generated, and a bottom gate terminal shorted to its source terminal.

14. The driver circuit of claim 12, further comprising:

a third discharge transistor having a drain terminal coupled to the gate terminal of the second transistor, a source terminal coupled to the second ground power supply line, a gate terminal configured to receive the clear signal, and a bottom gate terminal coupled to the second ground power supply line.

15. The driver circuit of claim 14, further comprising:

a fourth discharge transistor having a drain terminal coupled to the gate terminal of the first transistor, a source terminal coupled to the second ground power supply line, a gate terminal configured to receive the clear signal, and a bottom gate terminal coupled to the second ground power supply line.

16. The driver circuit of claim 15, further comprising:

an additional transistor having a drain terminal coupled to a second positive power supply line different than the first positive power supply line, a gate terminal coupled to the gate terminal of the first transistor, a source terminal, and a bottom gate terminal shorted to its source terminal.

\* \* \* \* \*